(12) United States Patent
Tu et al.

(10) Patent No.: US 6,576,548 B1
(45) Date of Patent: Jun. 10, 2003

(54) METHOD OF MANUFACTURING A SEMICONDUCTOR DEVICE WITH RELIABLE CONTACTS/VIAS

(75) Inventors: Amy Tu, San Jose, CA (US); Minh Van Ngo, Fremont, CA (US); Austin Frenkel, Radebeul (DE); Robert J. Chiu, Mt. View, CA (US); Jeff Erhardt, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/079,861

(22) Filed: Feb. 22, 2002

(51) Int. Cl.[7] .......................................... H01L 21/4763
(52) U.S. Cl. ...................... 438/640; 438/685; 438/701; 438/713
(58) Field of Search ................... 438/637, 638, 438/640, 666, 668, 685, 701, 713, 734

(56) References Cited

U.S. PATENT DOCUMENTS

| | | | | |
|---|---|---|---|---|
| 5,108,952 A | * | 4/1992 | Matsuhashi | 438/685 |
| 6,048,792 A | * | 4/2000 | Watanabe et al. | 438/637 |
| 6,117,781 A | * | 9/2000 | Lukanc et al. | 438/692 |
| 6,117,782 A | * | 9/2000 | Lukanc et al. | 438/692 |
| 6,121,149 A | * | 9/2000 | Lukanc et al. | 438/692 |
| 6,211,071 B1 | * | 4/2001 | Lukanc et al. | 438/640 |
| 6,277,731 B1 | * | 8/2001 | Gonzalez et al. | 438/713 |
| 6,426,287 B2 | * | 7/2002 | Blalock et al. | 438/701 |
| 6,448,183 B1 | * | 9/2002 | Lee | 438/701 |

* cited by examiner

*Primary Examiner*—John F. Niebling
*Assistant Examiner*—Lynne A. Gurley

(57) ABSTRACT

Reliable contacts/vias are formed by sputter etching to flare exposed edges of an opening formed in a dielectric layer, depositing a composite barrier layer and then filling the opening with tungsten at a low deposition rate. The resulting contact/via exhibits significantly reduced porosity and contact resistance. Embodiments include sputter etching to incline the edges of an opening formed in an oxide dielectric layer, e.g., a silicon oxide derived from TEOS or BPSG, at an angle of about 83° to about 86°, depositing a thin layer of Ti, e.g., at a thickness of about 250 Å to about 350 Å, depositing at least one layer of titanium nitride, e.g., three layers of titanium nitride, at a total thickness of about 130 Å to about 170 Å, and then depositing tungsten at a deposition rate of about 1,900 to about 2,300 Å/min to fill the opening.

20 Claims, 5 Drawing Sheets

METHOD OF MANUFACTURING A SEMICONDUCTOR DEVICE WITH RELIABLE CONTACTS/VIAS

FIELD OF THE INVENTION

The present invention relates to a method of manufacturing semiconductor devices with accurately formed sub-micron features. The present invention has particular applicability in manufacturing high density, multi-level flash-memory semiconductor devices with reliable, low resistance contacts/vias.

BACKGROUND ART

As integrated circuit geometries continue to plunge into the deep sub-micron regime, it becomes increasingly more difficult to accurately form discreet semiconductor devices exhibiting the requisite reliability and circuit speed. Implementation becomes particularly problematic in manufacturing flash memory devices having a design rule less than about 0.15 micron and under, e.g., less than about 0.12 micron and under.

Conventional semiconductor devices comprise a semiconductor substrate in which various elements are formed, such as transistors, and a plurality of overlying sequentially formed interlayer dielectrics and conductive patterns in which an interconnect system is formed comprising conductive lines. Typically, conductive patterns on different levels, i.e., upper and lower levels, are electrically connected by a conductive plug filling a via hole, while a conductive plug filling a contact hole establishes electrical contact with an active region on a semiconductor substrate, such as a source/drain region. A conductive plug filling a via hole is typically formed by depositing an interlayer dielectric (ILD) on a conductive level comprising at least one conductive feature, forming in an opening through the ILD by conventional photolithographic and etching techniques and filling the opening with a conductive material. Excess conductive material or the overburden on the surface ILD is typically removed by chemical-mechanical polishing (CMP). One such method is known damascene and basically involve forming an opening in the ILD and filling the opening with a metal. Dual damascene techniques involve forming an opening comprising a lower contact hole or via hole section in communication with an upper trench section, which opening is filled with a conductive material, typically a metal, to simultaneously form a conductive plug in electrical contact with an upper conductive line.

As geometries proceed into the deep sub-micron regime, the formation of reliable, low resistance contacts and interconnects becomes particularly problematic. For example, as contact/via openings are reduced in diameter and the aspect ratio (depth/diameter) increased, the openings become more vulnerable to defects, such as seams and coring in the form of porosity running through the central portion of the contact or via. Such seams and coring undesirably result in high and unstable contact resistance distribution.

Accordingly, there exists a need for methodology enabling the manufacture of semiconductor devices with improved reliability, including semiconductor devices containing MOS transistors as well as flash memory devices, such as electrically erasable programmable read only memory (EEPROM) devices. There exists a particular need for methodology enabling the manufacture of semiconductor devices having features in the deep sub-micron range and containing reliable and low resistance contacts and vias.

DISCLOSURE OF THE INVENTION

An advantage of the present invention is a method of manufacturing a semiconductor device exhibiting improved reliability.

Another advantage of the present invention is a method of manufacturing a semiconductor device having features in the deep sub-micron regime with highly reliability vias and contacts exhibiting low and stable contact resistance distribution.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an opening extending into a dielectric layer from and having edges at the main surface of the dielectric layer; sputter etching to remove dielectric material from the dielectric layer and flare the edges of the opening such that they are tapered at an angle less than 90° from the main surface of the dielectric layer; depositing a barrier layer lining the opening; and depositing tungsten (W) at a deposition rate of about 1,900 to about 2,300 Å/min.

Embodiments of the present invention comprise forming an opening in an oxide dielectric layer, such as a boron-phosphorus-doped silicated glass (BPSG) or a composite oxide layer comprising a BPSG layer with a silicon oxide layer derived from tetraethyl orthosilicate (TEOS) thereon, sputter etching to remove about 180 Å to about 230 Å of material from the oxide layer, thereby tapering the edges of the opening so that they are inclined at an angle of about 83° to about 86° with respect to the main surface of the dielectric layer, depositing an initial barrier layer of titanium (Ti) and then depositing at least one layer, e.g., three layers, of titanium nitride on the titanium layer. The opening is then filled with W at the low deposition rate and at a relatively low temperature, e.g., from about 400° C. to about 430° C.

Additional advantages of the present invention will become readily apparent to those skilled in the art from the following detailed description wherein the embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
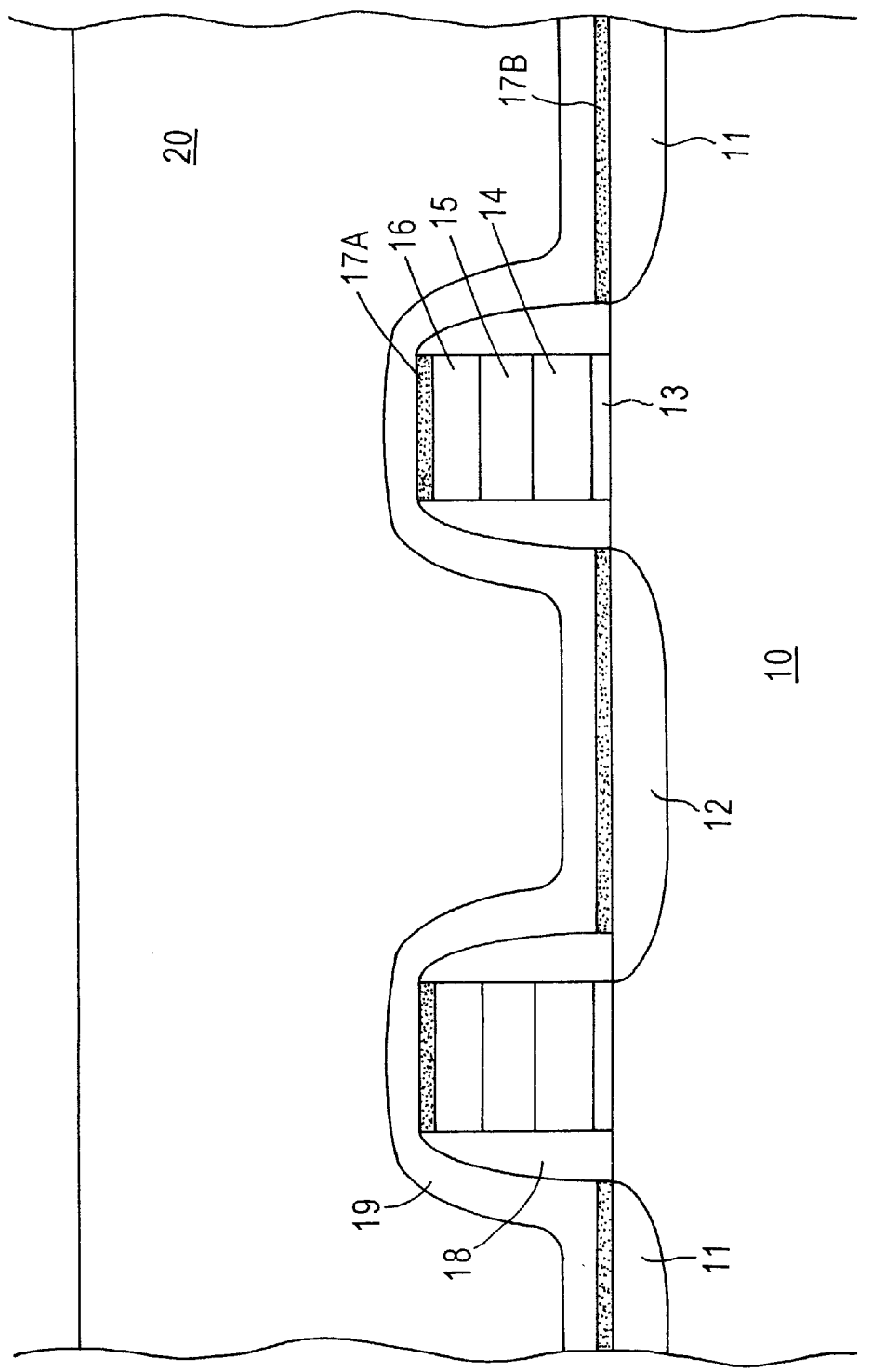
FIGS. 1 through 5 schematically illustrate sequential phases of a method in accordance with an embodiment of the present invention.

The present invention addresses and solves contact/via reliability problems stemming from the undesirable formation of seams and coring, with attendant high and unstable contact resistance distribution, particularly as device geometries are reduced into the deep sub-micron regime. The present invention provides efficient methodology enabling formation of contacts and vias with greater reliability by enabling complete filling of contact and via holes with metal with no or substantially reduced seams or porosity, thereby reducing contact resistance and providing a tighter resistance distribution.

In accordance with embodiments of the present invention, a contact/via opening is formed in a dielectric layer, such as an oxide layer, e.g., BPSG or silicon oxide derived from TEOS, and argon sputter etching is conducted to remove about 180 Å to about 230 Å, e.g., about 200 Å, of dielectric material, thereby flaring the edges of the opening, as at an angle of about 83° to about 86° with respect to the surface of the dielectric layer. The flared shape of the opening facilitates metal filling of the opening with reduced overhang.

After flaring the opening, a barrier layer composite is formed lining the opening. In accordance with embodiments of the invention, an initial thin Ti layer, as at a thickness of about 250 Å to about 350 Å, e.g., about 300 Å, is deposited to line the opening. Subsequently, a layer of titanium nitride is deposited on the initial Ti layer. The titanium nitride layer is advantageously deposited as a plurality of layers, such as about three layers, at a total thickness of about 130 Å to about 170 Å, e.g., about 150 Å, with each of the three layers of titanium nitride at a thickness of about 50 Å. Conventional deposition techniques may be employed. For example, the Ti layer may be deposited by physical vapor deposition (PVD), while the titanium nitride layers may be deposited by chemical vapor deposition (CVD). After depositing the barrier layer composite, W is deposited at a low deposition rate, such as about 1,900 to about 2,300 Å/min vis-à-vis conventional deposition rate of about 2,500 to about 2,900 Å/min.

Advantageously, the formation of a flared opening in combination with an initial very thin layer of Ti and a low W deposition rate enables filling contact and via openings with reduced piping holes. Such piping holes are typically formed using conventional practices wherein the openings are not flared, an initial thin Ti layer is not deposited and the W deposition rate is relatively high. Such piping holes typically contain slurry and moisture which leads to corrosion and out-gassing, increased resistance and increased resistance distribution. The present invention, therefore, provides enabling methodology for completely filling contact holes using a relatively low W deposition rate at a relatively low temperature, e.g., about 400° C. to about 430° C., e.g., about 415° C.

A method in accordance an embodiment of the present invention is schematically illustrated in FIGS. 1 through 5, wherein similar features or elements are denoted by similar reference characters. Adverting to FIG. 1, transistors are formed on substrate 10. The transistors can comprise MOS transistors and/or dual gate memory cell transistors comprising floating and control gates with an interpoly (ONO) dielectric layer between. For example, the transistors can comprise a tunnel oxide 13, a floating gate electrode 14, an ONO stack interpoly dielectric 15, and a control gate 16. A layer of metal silicide 17A, e.g., nickel silicide, is formed on the upper surface of the gate electrode stack, while a layer of metal silicide 17B, e.g., nickel silicide, is formed on the source/drain regions 11, 12. A dielectric sidewall spacer 18, such as silicon oxide, silicon oxynitride or silicon nitride, is formed on the side surfaces of the gate electrode, and a silicon nitride etch stop layer 19 typically deposited thereon. A dielectric layer, such as BPSG, or a composite of BPSG and silicon oxide derived from TEOS thereon, is deposited, as at a thickness of about 7,500 Å to about 8,500 Å, e.g., about 8,000 Å.

Figure 2:
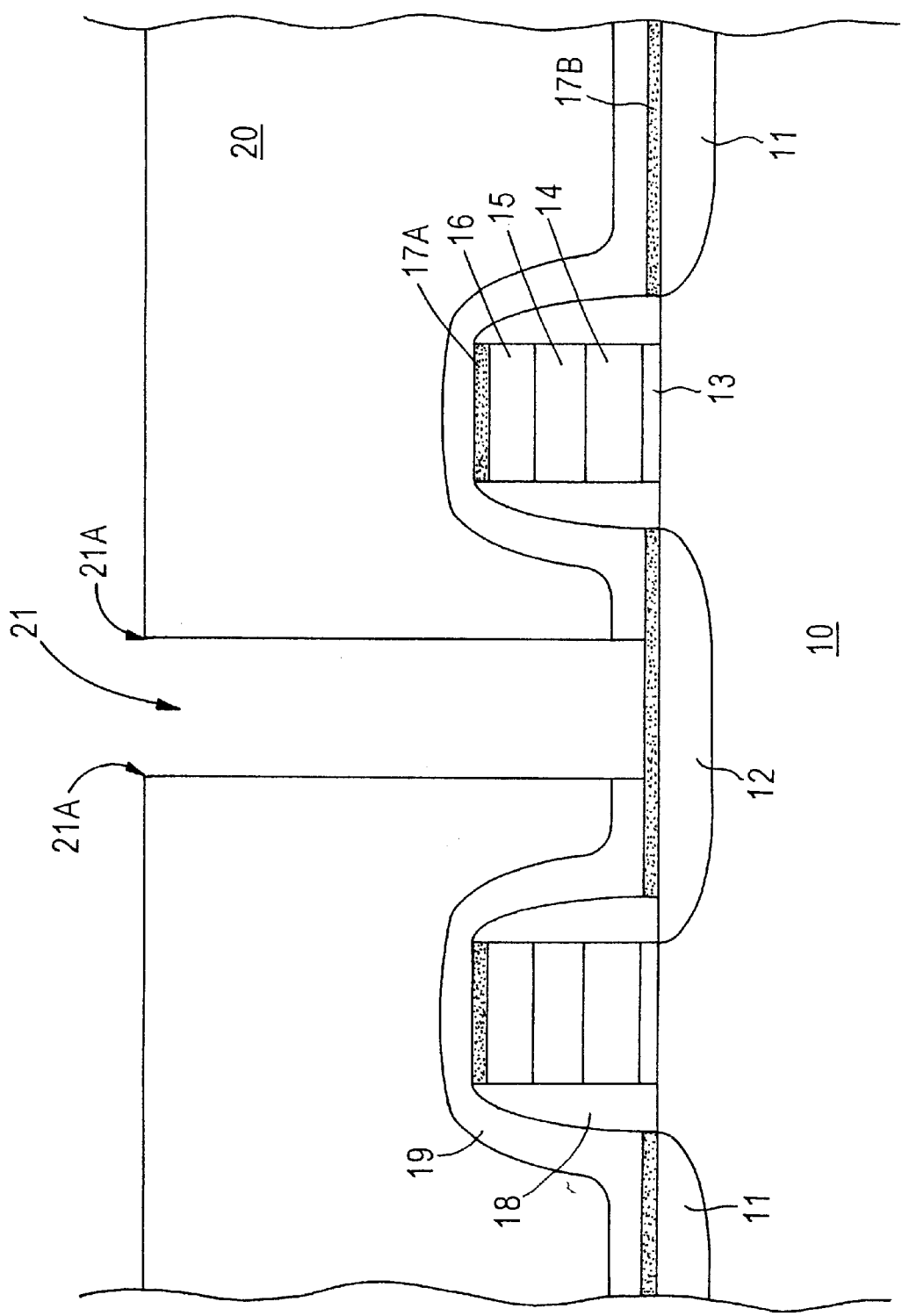

Conventional photolithographic and etching techniques are then implemented to form contact opening 21 in dielectric layer 20 exposing source/drain region 10, as schematically illustrated in FIG. 2. As also shown in FIG. 2, the edges of the opening 21A are substantially vertical, e.g., at an angle of about 90° with respect to the upper surface of the dielectric layer 20.

Figure 3:
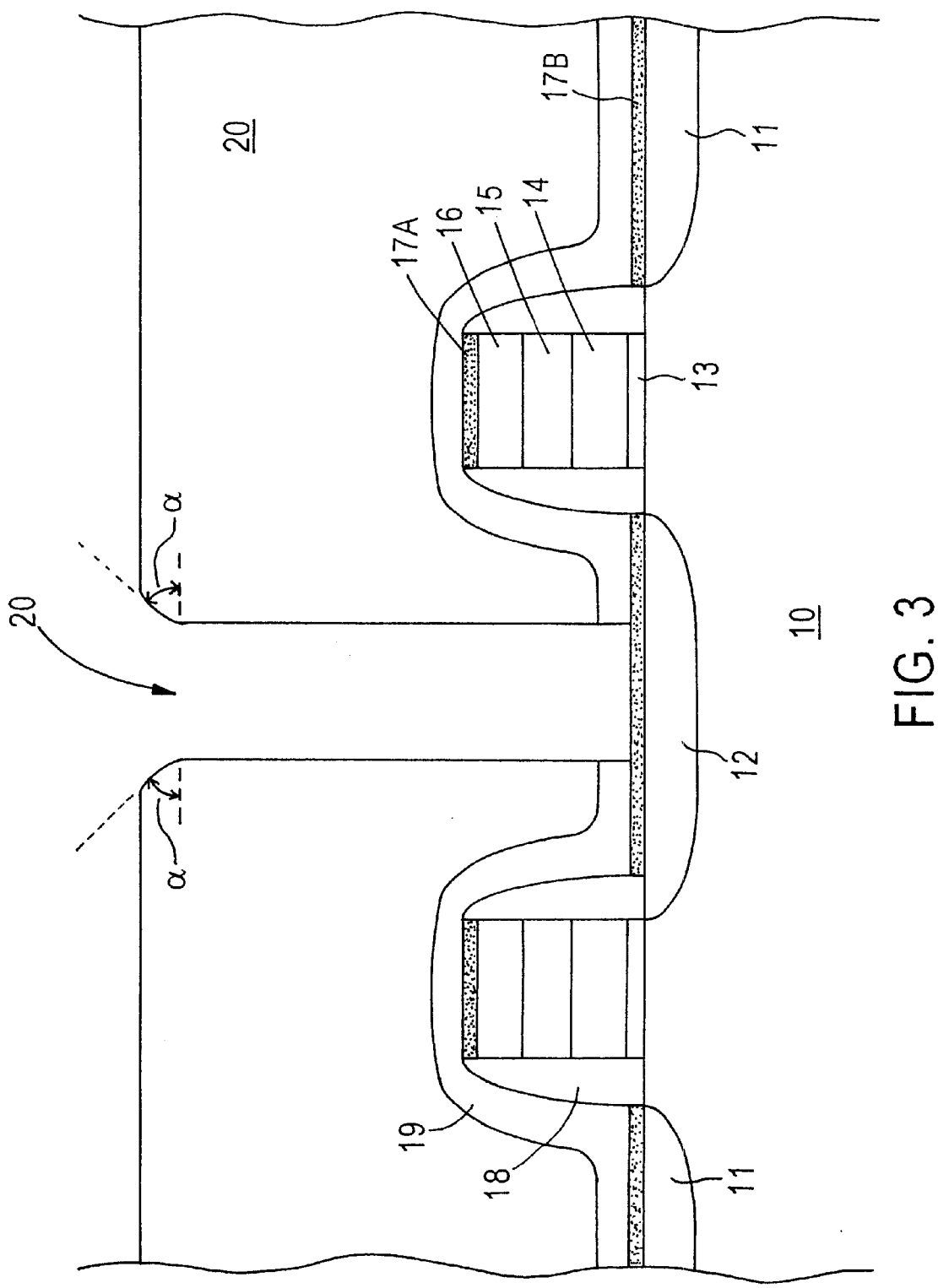

Subsequently, sputter etching is conducted, such as argon sputter etching, to remove a portion of the dielectric material from dielectric layer 20, such as about 180 Å to about 230 Å, e.g., about 200 Å. Such argon sputter etching results in tapering or flaring the edges of 21A of contact opening 20, such that the edges extend at an angle, α from the surface of the dielectric layer 20 of about 83° to about 86°, as schematically illustrated in FIG. 3. Such flaring facilitates filling of the contact opening 20. Sputter etching techniques are conventional and, hence, not set forth herein in detail. For example, such techniques are typically implemented in an inductively coupled plasma source sputter etch chamber in which a pedestal supports an electrostatic chuck and functions as an RF powered cathode. The chamber walls typically form an RF anode. An electrostatic attractive force is generated by the chuck to retain the wafer in a stationary position during processing. A voltage is applied to one or more electrodes embedded within a ceramic chuck body to induce opposite plurality charges in the wafer and electrodes, respectively. The opposite charges pull the wafer against the chuck support surface, thereby electrostatically clamping the wafer. An additional coil on the outside surface of the chamber lid is energized with RF power that inductively couples through the lid and into the chamber. The electric field generated between the anode and cathode along with the inductively coupled power from the coil ionizes a reactant gas introduced into the chamber, e.g., argon, to produce a plasma. Ions from the plasma bombard the wafer to effect etching.

Figure 4:
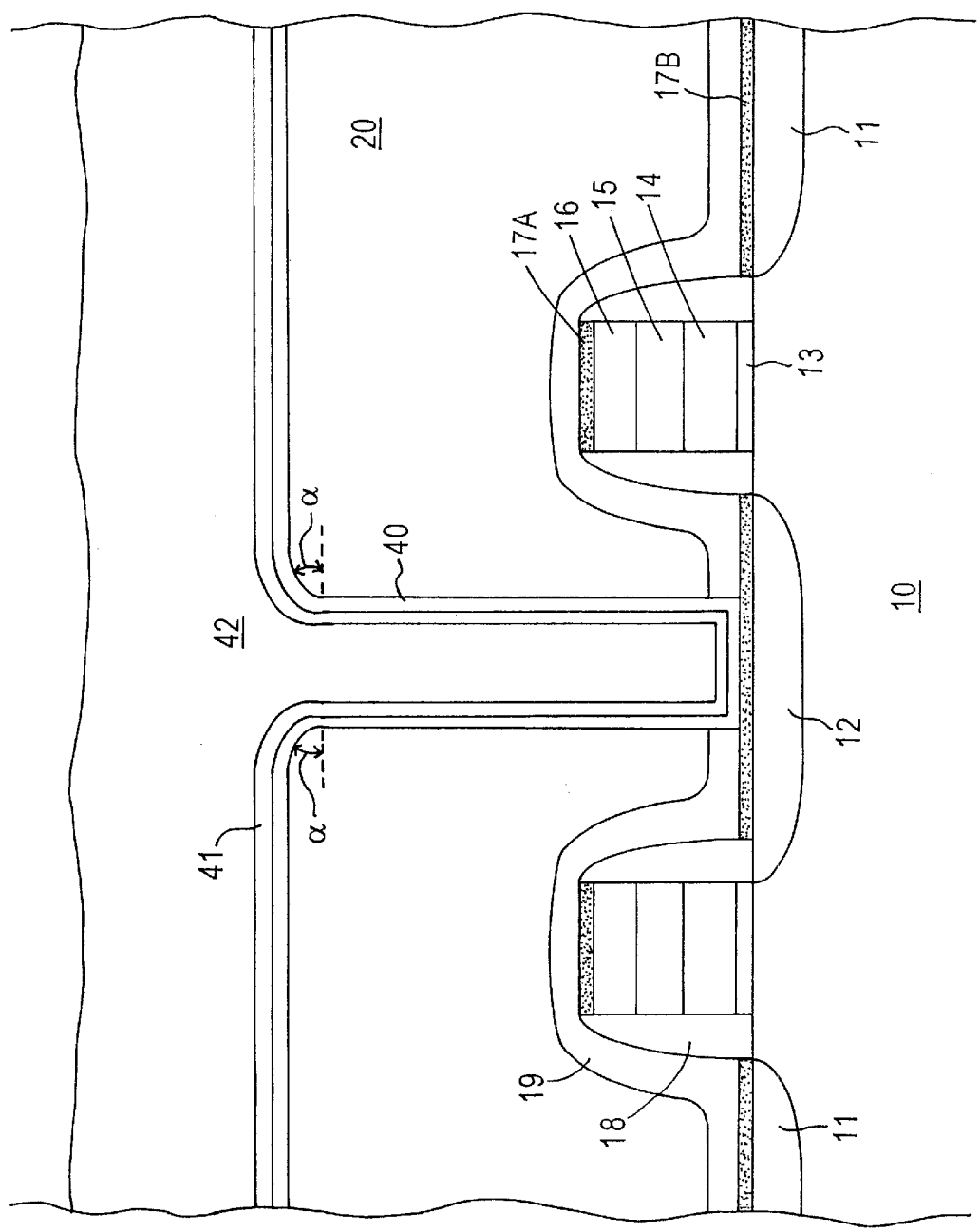
Figure 5:
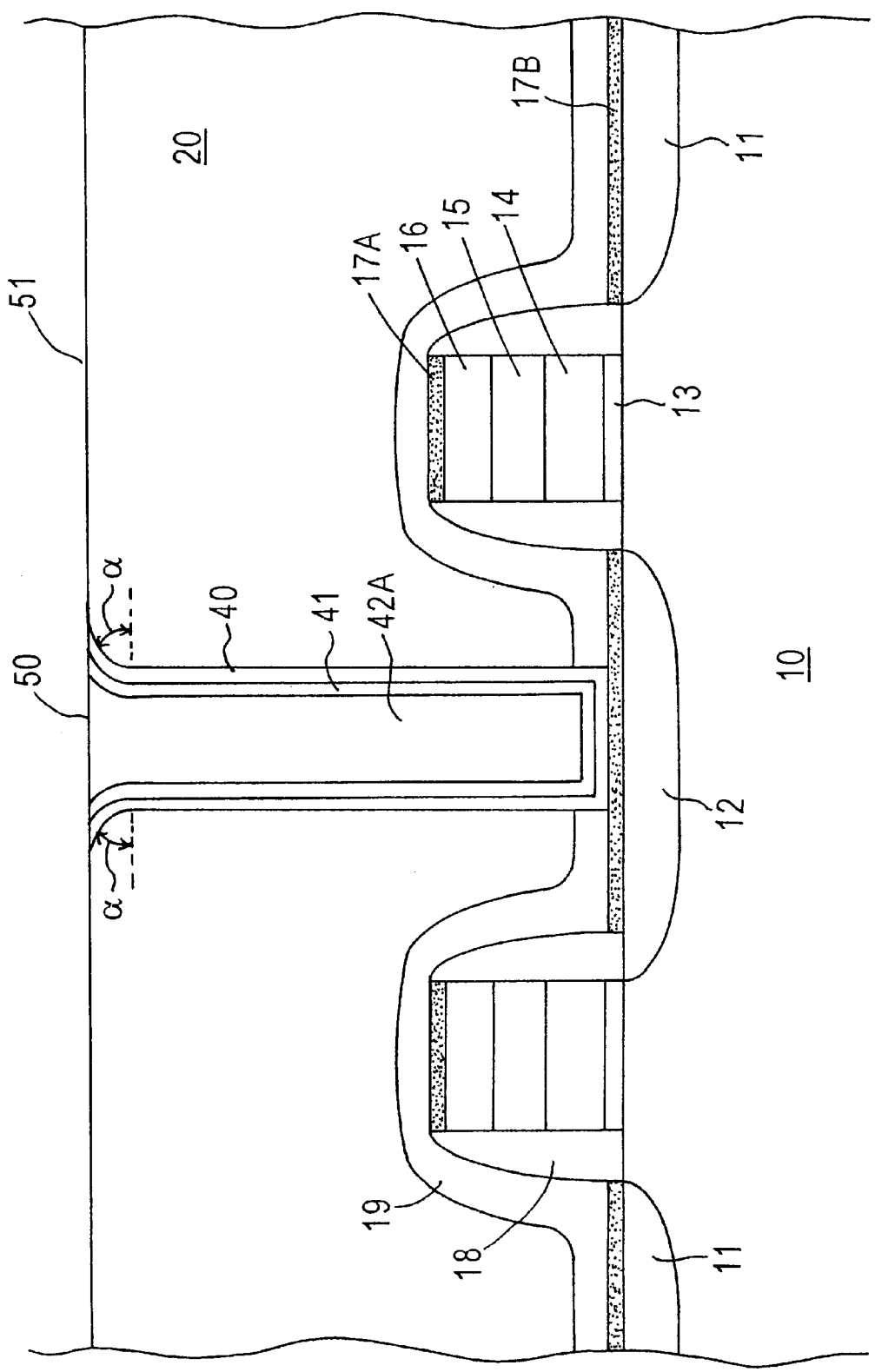

Adverting to FIG. 4, an initial layer of Ti 40 is deposited at a relatively small thickness as at about 250 Å to about 350 Å, e.g., about 300 Å, by PVD. Three layers of titanium nitride 41 are then deposited at a total of thickness of about 130 Å to about 170 Å, e.g., 150 Å with each layer at a thickness of about 50 Å, to form a composite barrier layer lining the opening and on the upper surface of the dielectric layer 20. Subsequently, as also schematically illustrated in FIG. 4, a layer of tungsten 42 is deposited at a relatively low deposition rate, such as about 1,900 to about 2,300 Å/min and at a temperature of about 400° C. to about 430° C., e.g., about 415° C., to fill the contact opening and form an overburden. Planarization is then conducted, as by a conventional etch back or CMP technique, to form W plug 42A having an upper surface 50 which is substantially flush with the upper surface 51 of dielectric layer 20.

The present invention, provides methodology enabling the complete filling of openings in dielectric layers, particularly contact openings and via openings having a high aspect ratio, e.g., greater than 3, with reduced seams and/coring, thereby reducing contact resistance and stabilizing contact resistance distribution to provide a tighter resistance distribution. The inventive enabling methodology comprises flaring the edges of the contact opening, depositing a relatively thin layer of Ti and then depositing W at a low temperature and low deposition rate.

The present invention enjoys industrial applicability in manufacturing any of various types of semiconductor devices with improved reliability and increased circuit speed. The present invention has particular applicability in manufacturing semiconductor devices with design features in the deep sub-micron regime, such as flash memory devices, e.g., EEPROMs, with a design rule of about 0.15 micron and under, e.g., about 0.12 micron and under, with significantly improved reliability, increased circuit speed and improved manufacturing throughput.

In the preceding detailed description, the present invention is described with reference to specific exemplary embodiments thereof. It will, however, be evident that various modifications and changes may be made thereto without departing from the broader scope of the present invention, as set forth in the claims. The specification and drawings are, accordingly, to be regarded as illustrative and not as restrictive. It is understood that the present invention is capable of use in various other combinations and environments and is capable of changes or modifications within the scope of the inventive concept and expressed herein.

What is claimed is:

1. A method of manufacturing a semiconductor device, the method comprising:

forming an opening extending into a dielectric layer from and having edges at a main surface of the dielectric layer;

sputter etching to remove dielectric material from the dielectric layer and flare the edges of the opening such that they are tapered at an angle less than 90° from the main surface of the dielectric layer;

depositing a barrier layer lining the opening; and depositing tungsten (W) at a deposition rate of about 1,900 to about 2,300 Å/min.

2. The method according to claim 1, wherein the dielectric material comprises an oxide.

3. The method according to claim 2, wherein the oxide comprises a boron-phosphorus-doped silicate glass (BPSG).

4. The method according to claim 3, comprising sputter etching to remove about 180 Å to about 230 Å of dielectric material from the BPSG layer.

5. The method according to claim 4, where the angle is about 83° to about 86°.

6. The method according to claim 1, comprising sputter etching to remove about 180 Å to about 230 Å of dielectric material.

7. The method according to claim 6, wherein the angle is about 83° to about 86°.

8. The method according to claim 1, comprising depositing the barrier layer by sequentially:

depositing a layer of titanium (Ti); and depositing at least one layer of titanium nitride on the Ti layer.

9. The method according to claim 8, comprising depositing the Ti layer at a thickness of about 250 Å to about 350Å.

10. The method according to claim 9, comprising depositing the at least one layer of titanium nitride at a thickness of about 130 Å to about 170Å.

11. The method according to claim 10, comprising three layers of titanium nitride at a total thickness of about 130 Å to about 170Å.

12. The method according to claim 1, where the opening is a contact opening through the dielectric layer to a source/drain region in a substrate.

13. The method according to claim 12, comprising forming the contact opening with an aspect ratio, (depth/diameter) greater than 3.

14. The method according to claim 12, wherein the semiconductor device comprises a non-volatile memory device.

15. The method according to claim 3, wherein the dielectric layer further comprises a layer of silicon oxide derived from tetra-ethyl orthosilicate (TEOS) on the BPSG layer.

16. The method according to claim 15, comprising removing about 180 Å to about 230 Å from the silicon oxide layer derived from TEOS.

17. The method according to claim 16, wherein the angle is about 83° to about 86°.

18. The method according to claim 1, comprising depositing the W at a temperature of about 400° C. to about 430° C.

19. The method according to claim 1, comprising chemical mechanical polishing (CMP) such that the upper surface of the W filling in the opening is substantially flush with the main surface of the dielectric layer.

20. The method according to claim 1, comprising forming the opening with an aspect ratio (depth/diameter) greater than 3.

* * * * *